United States Patent
Hohenwarter et al.

(10) Patent No.: US 9,316,443 B2
(45) Date of Patent: *Apr. 19, 2016

(54) METHOD AND APPARATUS FOR LIQUID TREATMENT OF WAFER SHAPED ARTICLES

(75) Inventors: Karl-Heinz Hohenwarter, Dellach/Gail (AT); Vijay Badam, Villach (AT); Christoph Semmelrock, Klagenfurt (AT)

(73) Assignee: LAM RESEARCH AG, Villach (AT)

( * ) Notice: Subject to any disclaimer, the term of this patent is extended or adjusted under 35 U.S.C. 154(b) by 609 days.

This patent is subject to a terminal disclaimer.

(21) Appl. No.: 13/593,264

(22) Filed: Aug. 23, 2012

(65) Prior Publication Data

US 2014/0054280 A1   Feb. 27, 2014

(51) Int. Cl.
   *F27D 5/00*   (2006.01)
   *H01L 21/67*   (2006.01)

(52) U.S. Cl.
   CPC .......... *F27D 5/0037* (2013.01); *H01L 21/6708* (2013.01); *H01L 21/6715* (2013.01); *H01L 21/67051* (2013.01); *H01L 21/67115* (2013.01)

(58) Field of Classification Search
   None
   See application file for complete search history.

(56) References Cited

U.S. PATENT DOCUMENTS

| | | | |
|---|---|---|---|
| 4,903,717 A | 2/1990 | Sumnitsch | |
| 4,982,693 A * | 1/1991 | Ebata | 118/725 |
| 5,859,408 A * | 1/1999 | Baxendine | 219/390 |
| 5,882,433 A | 3/1999 | Ueno | |
| 5,965,047 A * | 10/1999 | Blersch et al. | 219/390 |
| 6,198,074 B1 * | 3/2001 | Savas | 219/390 |
| 6,443,168 B1 | 9/2002 | Morita et al. | |
| 6,536,454 B2 | 3/2003 | Lindner | |
| 7,509,035 B2 * | 3/2009 | Ranish et al. | 392/416 |
| 7,837,803 B2 | 11/2010 | Hohenwarter | |
| 7,891,314 B2 | 2/2011 | Pilcher | |
| 8,294,068 B2 * | 10/2012 | Ranish et al. | 219/395 |
| 2003/0213436 A1 * | 11/2003 | Kwon | 118/725 |
| 2006/0086713 A1 * | 4/2006 | Hunter et al. | 219/411 |
| 2007/0113872 A1 * | 5/2007 | Uchida et al. | 134/26 |
| 2010/0054720 A1 * | 3/2010 | Hunter et al. | 392/416 |
| 2010/0055314 A1 * | 3/2010 | Kato et al. | 427/255.28 |
| 2010/0200163 A1 | 8/2010 | Puggi et al. | |
| 2010/0236579 A1 * | 9/2010 | Araki et al. | 134/26 |
| 2011/0151675 A1 | 6/2011 | Frank et al. | |
| 2012/0103371 A1 | 5/2012 | Yun et al. | |
| 2013/0061805 A1 * | 3/2013 | Jin et al. | 118/725 |

(Continued)

FOREIGN PATENT DOCUMENTS

EP   1791161 A2 *  5/2007   .............. H01L 21/00
WO   2004084278      9/2004

(Continued)

OTHER PUBLICATIONS

U.S. Appl. No. 13/229,097, filed Sep. 9, 2011.

(Continued)

*Primary Examiner* — Joseph M Pelham
(74) *Attorney, Agent, or Firm* — Young & Thompson

(57) ABSTRACT

In an apparatus and process for treating wafer-shaped articles, a spin chuck holds a wafer-shaped article in a predetermined orientation relative to an upper surface of the spin chuck. The apparatus includes a heating assembly having a housing that contains at least one infrared heating element. The heating assembly is mounted above an upper surface of the spin chuck and adjacent a wafer-shaped article when mounted on the spin chuck. The housing comprises a gas inlet connected to a gas supply, and at least one outlet for discharging gas from the housing.

13 Claims, 2 Drawing Sheets

(56) References Cited

U.S. PATENT DOCUMENTS

2013/0061873 A1*  3/2013  Hohenwarter et al. ........ 134/1.3
2014/0102637 A1*  4/2014  Brugger et al. .......... 156/345.23

FOREIGN PATENT DOCUMENTS

| WO | 2006008236 | 1/2006 |
| WO | 2009010394 | 1/2009 |
| WO | 2011007287 | 1/2011 |

OTHER PUBLICATIONS

U.S. Appl. No. 12/914,802, filed Oct. 28, 2010, (US 2012-0103371 A1).

U.S. Appl. No. 12/668,940, filed Jan. 13, 2010, (US 2010-0200163 A1) and corresponds with WO2009/010394.

U.S. Appl. No. 12/642,117, filed Dec. 18, 2009 (US 2011-0151675 A1).

* cited by examiner

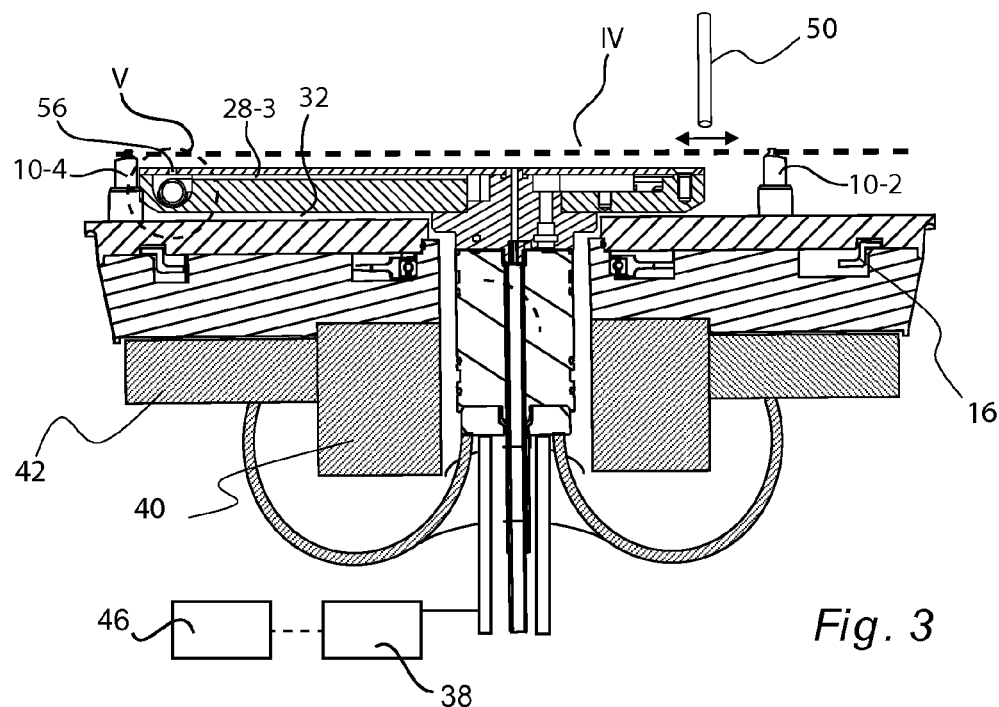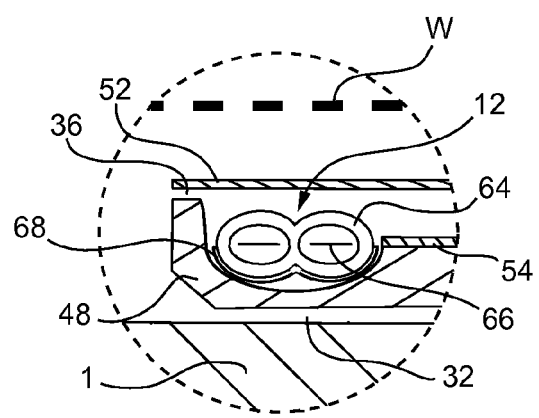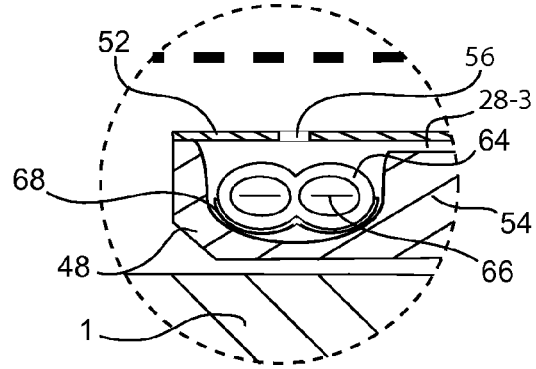
Fig. 3
Fig. 4
Fig. 5

METHOD AND APPARATUS FOR LIQUID TREATMENT OF WAFER SHAPED ARTICLES

BACKGROUND OF THE INVENTION

1. Field of the Invention

The invention relates to a method and apparatus for liquid treatment of wafer-shaped articles.

2. Description of Related Art

Liquid treatment includes both wet etching and wet cleaning, wherein the surface area of a wafer to be treated is wetted with a treatment liquid and a layer of the wafer is thereby removed or impurities are thereby carried off. A device for liquid treatment is described in U.S. Pat. No. 4,903,717. In this device the distribution of the liquid may be assisted by the rotational motion imparted to the wafer.

Techniques for drying a surface of a disc-shaped article are typically used in the semiconductor industry after cleaning a silicon wafer during production processes (e.g. pre-photo clean, post CMP-cleaning, and post plasma cleaning). However, such drying methods may be applied for other plate-like articles such as compact discs, photo masks, reticles, magnetic discs or flat panel displays. When used in semiconductor industry it may also be applied for glass substrates (e.g. in silicon-on-insulator processes), III-V substrates (e.g. GaAs) or any other substrate or carrier used for producing integrated circuits.

Various drying methods are known in the semiconductor industry, some of which utilize isopropyl alcohol to reduce surface tension of rinse water on a semiconductor wafer surface. See, e.g., U.S. Pat. No. 5,882,433. Improvements upon such methods, involving the use of heated isopropyl alcohol, are described in commonly-owned patent applications WO 2011/007287 and U.S. Ser. No. 12/914,802 (filed Oct. 28, 2010).

There remains a need, however, to develop improved methods for preventing pattern collapse in the submicroscopic structures formed on such semiconductor wafers, not only during such drying process but also during other liquid treatments. Pattern collapse can occur when the surface tension of a liquid moving radially outwardly across the surface of a rotating wafer applies a damaging or destructive force to the submicroscopic structures formed on the wafer surface.

The problem of pattern collapse becomes more serious as the diameter of semiconductor wafers increases. For example, the current generation of single wafer wet processing technology is designed for 300 mm diameter wafers, but the previous generation technology was designed for 200 mm wafers and a next generation may be designed for wafers of 450 mm or larger diameter.

In particular, as the wafer diameter increases, so too will the temperature differential between a liquid at the point where it is applied in a central region of the wafer and the same liquid after it has travelled radially outwardly to the periphery of the wafer.

The problem of pattern collapse also becomes more serious as the aspect ratio of the submicroscopic structures continues to increase. This is also an ongoing trend in the manufacture of semiconductor devices, as the pressure to reduce device dimensions in general applies more to the horizontal layout and less to the thickness direction.

Commonly-owned copending application Ser. No. 13/229,097, filed Sep. 9, 2011, describes a spin chuck with an infrared heater mounted stationarily between an upper surface of the rotating chuck and a lower surface of the rotating wafer held thereby. While this chuck provides improved wafer heating, a need has been identified to improve the consistency of the system performance from one wafer to the next.

SUMMARY OF THE INVENTION

Thus, in one aspect, the present invention relates to an apparatus for treating a wafer-shaped article, comprising a spin chuck for holding a wafer-shaped article in a predetermined orientation relative to an upper surface of the spin chuck. A heating assembly comprises a housing containing at least one infrared heating element, and is mounted above the upper surface of the spin chuck and adjacent a wafer-shaped article when mounted on the spin chuck. The housing of the heating assembly comprises a gas inlet connected to a gas supply, and at least one outlet for discharging gas from the housing.

In preferred embodiments of the apparatus according to the present invention, the heating assembly is mounted underlying a wafer-shaped article when mounted on the spin chuck, the heating assembly being stationary in relation to rotation of the spin chuck.

In preferred embodiments of the apparatus according to the present invention, the at least one outlet is positioned in a peripheral region of the spin chuck and opens on a radially outwardly facing surface of the housing.

In preferred embodiments of the apparatus according to the present invention, the at least one outlet opens on an axially upwardly facing surface of the housing, thereby to discharge gas from the housing onto a downwardly-facing surface of a wafer shaped article when mounted on the spin chuck.

In preferred embodiments of the apparatus according to the present invention, a temperature sensor is positioned within the housing and a flow controller adjusts a flow of gas into the housing based upon a temperature detected within the housing.

In preferred embodiments of the apparatus according to the present invention, the flow controller is configured to set a flow of gas to a first flow rate, which is preferably in a range of 100-200 l/min, more preferably in an range of 120-180 l/min and most preferably in a range of 140-160 l/min, when the temperature sensor detects a temperature in excess of a predetermined cooling point, and to set a flow of gas to a second flow rate, which is preferably in a range of 10-80 l/min, more preferably in an range of 15-60 l/min and most preferably in a range of 20-40 l/min, when the temperature sensor detects a temperature not in excess of a predetermined cooling point.

In preferred embodiments of the apparatus according to the present invention, the at least one infrared heating element extends along a peripheral region of the housing and the gas inlet opens into a central region of the housing, with an interior chamber being defined between the at least one infrared heating element and the gas inlet, thereby to promote cooling of the at least one infrared heating element by convective heating of a gas supplied via the gas inlet to the interior chamber.

In preferred embodiments of the apparatus according to the present invention, the spin chuck comprises a chuck body mounted for rotation about a central stationary post, and the housing comprises a proximal end rigidly secured to the central stationary post and a distal end positioned above the chuck body and supported in a cantilevered manner via the proximal end.

In another aspect, the present invention relates to a process for treating a wafer-shaped article, comprising positioning a wafer-shaped article on a spin chuck in a predetermined orientation, wherein an infrared heating assembly comprising at least one infrared heating element contained within a housing is positioned adjacent the wafer-shaped article. The wafer-shaped article is heated with the infrared heating assembly. A gas is introduced into the housing through a gas inlet in the housing under conditions to cause conductive heating of the gas by the at least one infrared heating element. The heated gas is discharged from the housing through at least one outlet in the housing.

In preferred embodiments of the process according to the present invention, the heated gas is discharged radially outwardly of the housing and the spin chuck.

In preferred embodiments of the process according to the present invention, the heated gas is discharged axially upwardly from the housing onto a downwardly facing surface of the wafer-shaped article, thereby to heat the wafer shaped article conductively.

In preferred embodiments of the process according to the present invention, the at least one infrared heating element is switched off at a conclusion of the heating step, and gas is then introduced into the housing of the heating assembly at a first flow rate, which is preferably in a range of 100-200 l/min, more preferably in an range of 120-180 l/min and most preferably in a range of 140-160 l/min, until a temperature within the housing is lowered to a predetermined extent, whereupon the gas is then introduced into the housing of the heating assembly at a second flow rate, which is preferably in a range of 10-80 l/min, more preferably in an range of 15-60 l/min and most preferably in a range of 20-40 l/min, after a temperature within the housing has been lowered to the predetermined extent.

In preferred embodiments of the process according to the present invention, a temperature within the housing is monitored, and a flow rate of gas into the housing is adjusted based upon a temperature detected within the housing.

In preferred embodiments of the process according to the present invention, the spin chuck and the wafer shaped article are rotated during the heating, while maintaining the infrared heating assembly stationary relative to the spin chuck and the wafer shaped article.

In preferred embodiments of the process according to the present invention, gas is introduced into the housing of the infrared heating assembly during the heating step.

BRIEF DESCRIPTION OF THE DRAWINGS

Other objects, features and advantages of the invention will become more apparent after reading the following detailed description of preferred embodiments of the invention, given with reference to the accompanying drawings, in which:

FIG. 3 is a view like that of FIG. 2, of a chuck according to a second embodiment of the invention;

FIG. 4 is an enlarged view of the detail IV designated in FIG. 2; and

FIG. 5 is an enlarged view of the detail V designated in FIG. 3.

DETAILED DESCRIPTION OF PREFERRED EMBODIMENTS

Figure 1:
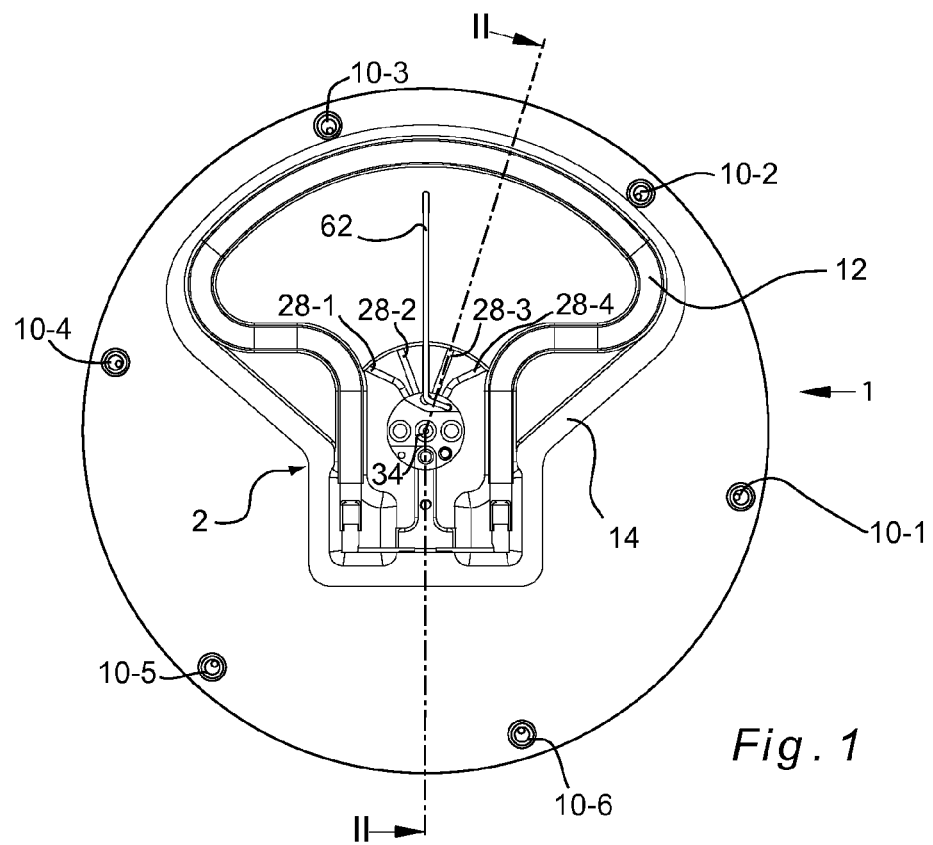
FIG. 1 is a top plan view of a chuck according to a first embodiment of the invention.
Figure 2:
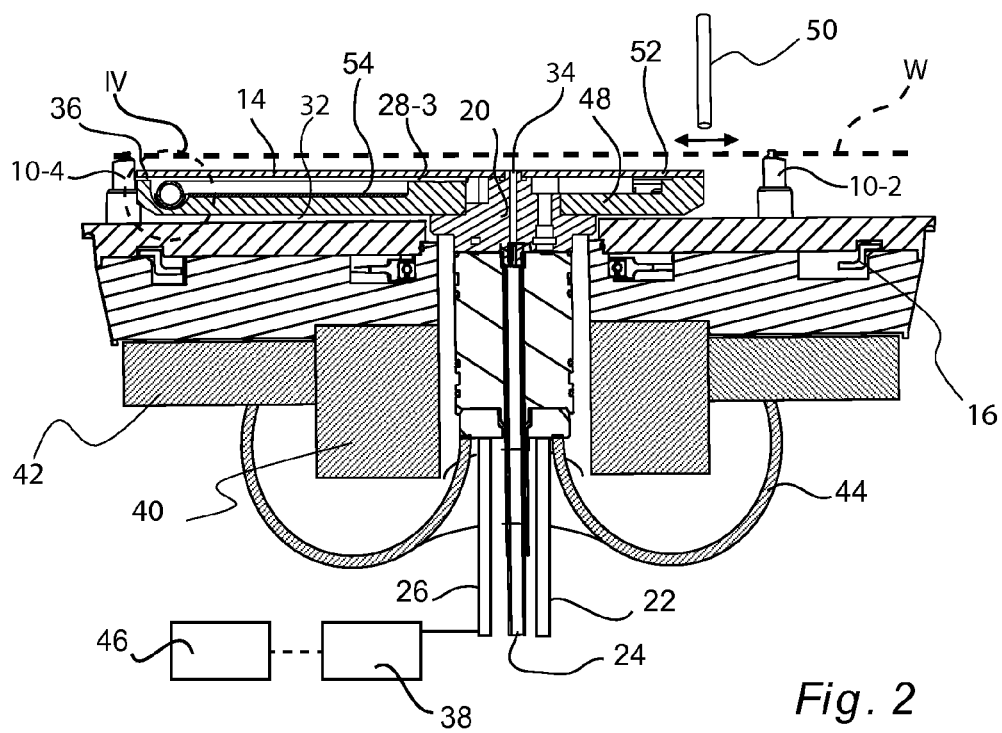
FIG. 2 is a partial axial section through the chuck depicted in FIG. 1, taken along the line II-II of FIG. 2, with a wafer in position as indicated in broken line.

Referring now to the drawings, FIGS. 1 and 2 depict a spin chuck 1 that holds a wafer W thereon in a predetermined orientation, which is preferably such that the major surfaces are disposed horizontally or within ±20° of horizontal. Spin chuck 1 may for example be a chuck that operates according to the Bernoulli principle, as described for example in U.S. Pat. No. 4,903,717.

Chuck 1 includes a series of gripping pins, which in this embodiment are six in number, designated 10-1 through 10-6. Gripping pins 10-1 to 10-6 prevent the wafer from sliding laterally off the chuck. In this embodiment, the upper portions of gripping pins 10-1 to 10-6 also provide subjacent support for wafer W, and thus the chuck need not operate according to the Bernoulli principle and need not be adapted to supply a gas cushion beneath wafer. In particular, each gripping pin 10-1 to 10-6 comprises an uppermost gripping portion that extends vertically from the cylindrical pin base, generally along an axis that is offset in relation to the rotation axis of the cylindrical pin base. The upper gripping portions furthermore each comprise a lateral recess or cut-out that is designed to accommodate the peripheral edge of a wafer, as is described in greater detail below.

Although not shown in the figures, the spin chuck may be surrounded by a process chamber, which may be a multi-level process chamber as described in commonly-owned U.S. Pat. No. 7,837,803 (corresponding to WO 2004/084278). The spin chuck can be positioned at the selected level by moving the chuck axially relative to the stationary surrounding chamber, or by moving the surrounding chamber axially relative to the axially-stationary chuck, as described in connection with FIG. 4 of U.S. Pat. No. 6,536,454.

Chuck 1 furthermore comprises a heating assembly 2 for heating the underside of a wafer mounted on the chuck. Heating assembly 2 is integrated with a stationary nozzle head 20 that supplies fluids to the downwardly-facing side of the wafer W.

Heating assembly 2 comprises a curved infrared heating element 12, which is received in a housing 14 whose periphery is of generally complementary shape. As is described hereinbelow, because heating assembly 2 remains stationary relative to the rotating chuck and the rotating wafer, the circumferential distribution of the heating elements may be neglected when designing the heating assembly, with the available heating power across the radius of the wafer being the principal design consideration.

Heating element 12 is preferably a single curved element; however, it is also within the scope of the invention to provide plural heating elements to the heating assembly, which may be linear or curved.

It is also preferred that the heating element or elements 12 be separately controllable in multiple zones, so as to tune the delivery of infrared radiation to different regions of the wafer and in accordance with the particular requirements of the process that is being performed on the apparatus.

Housing 14 is integrated with the stationary nozzle that forms the dispensing assembly of this embodiment. As shown in greater detail in FIG. 2, the dispensing assembly comprises a non-rotating (stationary) nozzle head 20 whose nozzles penetrate the cover of the heating assembly, as described below. In this embodiment, conduits 22 and 24 terminate in nozzles that open above housing 14, that is, the conduits 22, 24 pass entirely through housing 14 but do not open into the housing 14. These conduits may supply for example dry nitrogen gas and deionized water, respectively, to the underside surface of the wafer W. Conduit 26, on the other hand, leads to an inlet or a group of inlets that open into the interior of housing 14, and supplies gas such as nitrogen that is utilized for cooling the heating elements 12.

Conduit 24 is centrally arranged and is connected to a gas source. Gas such as nitrogen or ultra clean air is led through conduit 24 to its associated nozzle 34 and onto the downwardly-facing surface of the wafer. Conduit 24 may also supply nitrogen or ultra clean air as a purge gas to the space 32 between the underside of heater assembly 12 and the upper surface of spin chuck 1.

FIG. 2 also shows that the heating assembly 2 is mounted in a cantilever fashion such that it is spaced from both the overlying wafer W as well as from the rotating upper surface of chuck 1. Housing 14 is therefore rigid enough that it does not contact either the rotating surfaces of the chuck or the wafer. Although the housing 14 of this embodiment comprises a curved peripheral portion that extends along only about one third of the circumference of the chuck 1, it is also contemplated to configure the housing so that is covers substantially all of the surface of the spin chuck 1 within the circle defined by the gripping pins 10-1 through 10-6.

Spin chuck 1 is mounted to the rotor of a hollow-shaft motor 40 (schematically shown in FIG. 2), and the stationary nozzle head 20 penetrates through a central opening of the spin chuck 1. The stator of the hollow-shaft motor 40 is mounted to the mounting plate 42 (schematically shown in FIG. 2). Nozzle head 20 and mounting plate 42 are mounted to the same stationary frame 44 (schematically shown in FIG. 3).

Conduit 26 in this embodiment leads to a group of four channels 28-1, 28-2, 28-3 and 28-4, each of which opens into the interior of housing 14. As shown in FIG. 1, the inlets formed at the ends of these channels open into a relatively central region of housing 14, whereas infrared heating element 12 comprises a curved portion positioned in a peripheral region of housing 14. Thus, housing 14 in this embodiment includes an interior chamber between the infrared heating element 12 and the inlets of channels 28-1, 28-2, 28-3 and 28-4, where conductive heating of the gas introduced through these channels can occur as the gas contacts the hot heating element 12.

Channels 28-1, 28-2, 28-3 and 28-4 in this embodiment are approximately 2 mm in diameter and 3 mm in length, although these dimensions may of course be varied as a matter of design choice. Housing 14 also includes at least one outlet to permit heated gas to escape from the housing. One such outlet is visible at 36 in FIGS. 2 and 4, although in the present embodiment there are preferably four such outlets distributed across the wall of the housing that curves approximately concentrically with the chuck and wafer. Conduit 26 preferably feeds channels 28-1, 28-2, 28-3 and 28-4 through an opening of approximately 5 mm in diameter, and outlets 36 are preferably about 0.1 mm in diameter, which dimensions have been found to promote conductive heating of the supplied gas within housing 14 and hence cooling of the IR heating element 12. Again, however, those dimension may of course be varied as a matter of design choice.

Conduit 26 is connected to a supply 38 of cooling gas, which in this embodiment is nitrogen, and the flow of gas from that supply 38 is controlled by a computer-based microcontroller 46, which preferably also controls all operations of the spin chuck 1 as well as plural additional such spin chucks as will typically be present in a process module for single wafer wet processing of semiconductor wafers.

The main body 48 and cover 52 of housing 14 are preferably formed of a material that is substantially transparent to the wavelengths of radiation emitted by the IR heating element 12, with a preferred material for these housing components being quartz glass. Interior surfaces of the housing 14 that face upwardly are preferably coated with a quartz reflective coating 54. Coating 54 is a material that is reflective of the infrared radiation generated by the heating element 12. Such a coating 54 may for example be a metal, such as gold, or a non-metal, such as a film of opaque synthetic quartz material.

Also mounted within the housing 14 is a temperature sensor 62, whose output is utilized by microcontroller 46 to adjust the supply of gas from supply 38 to conduit 26, as will be described in more detail below.

Gripping elements 10-1 to 10-6 are provided with eccentrically mounted grippers. The gripping elements are conjointly rotated about their cylindrical axes by a tooth gear 16 that is in meshing engaging with all of the gripping elements. The eccentric grippers are thus moved in concert between a radially inner closed position in which a wafer W is secured, to a radially outer open position in which the wafer W is released. Gripping elements 10-1 to 10-6 can be made as described in commonly-owned U.S. application Ser. No. 12/668,940 (corresponding to WO 2009/010394, or as described in commonly-owned U.S. application Ser. No. 12/642,117, filed Dec. 18, 2009). Gripping elements 10-1 to 10-6 thus comprise an eccentric uppermost portion that contacts wafer W, projecting from a base that is mounted for pivotal movement about its central axis. In particular, a ring gear 16 is centered on the underside of the chuck upper body, and simultaneously engages via its peripheral gear teeth with gear teeth formed on the base of each of the pins 10-1 to 10-6. Pins 10-1 to 10-6 are evenly distributed about the periphery of spin chuck 1, with at least three and preferably six such pins 10 being provided.

An optional upper liquid dispenser 50 supplies treatment liquid from above, and can incorporate a plurality of different liquid dispensing nozzles for dispensing a variety of different treatment liquids, as described for example in commonly-owned U.S. Pat. No. 7,891,314 (corresponding to WO 2006/008236). Upper liquid dispenser 50 is preferably displaceable radially of the wafer W, to aid in spreading treatment liquid over the entire upwardly facing surface of wafer W as it is rotated on the spin chuck.

In the detail of FIG. 4, it can be seen that the wafer W is positioned above the upper surface of the heating assembly 2. On the other hand, the lower surface of the heating assembly 2 is spaced from the upper surface of the chuck 1 by the gap 32. Thus, as the chuck 1 and wafer W are rotated in unison, the heating assembly 2, whose housing 14 is integrated with the stationary nozzle 20, remains stationary.

Preferably, cover 52 forms a liquid-tight seal with housing body 48, other than where outlets 36 are formed, so as to exclude process liquids such as hot isopropyl alcohol from the housing 14 where they might otherwise contact heating element 12.

Heating element 12 in this embodiment preferably takes the form of a twin wall quartz tube 64, which contains a pair of tungsten heating coils 66 sealed inside the twin wall quartz tube 64, in an ambient of argon gas. Heating element 12 furthermore preferably comprises a coating or layer 68 on its lower half, which is a material that is reflective of the infrared radiation generated by the heating element 12. Such a coating 68 may for example be a metal, such as gold, or a non-metal, such as a film of opaque synthetic quartz material.

Heating element 12 in this embodiment preferably emits infrared radiation with a maximum peak at 1000 nm+/−300 nm. Those wavelengths correspond to the region of high absorption by silicon, which will often be the material of a wafer to be treated in the present apparatus. Preferably, the infrared heater is selected and operated so that an IR-spectrum is emitted, and so that the silicon of a silicon wafer absorbs at least 50% of the IR-radiation.

In the following a process for treating the wafer W shall be described. A wafer W, for example a 300 mm silicon wafer, is placed on the spin chuck 1 of FIGS. 1, 2 and 4, and securely held by gripping elements 10-1 to 10-6. The spin chuck is rotated at a spin speed of, for example, 500 rpm. A drying liquid comprising heated isopropyl alcohol is supplied to the center of the wafer upper surface at volume flow of 1500 ml/min through nozzle 50. Simultaneously the infrared heating assembly 2 is activated so as to heat the wafer to a desired temperature.

After the target temperature is reached, the infrared heating element 12 is switched off and nitrogen gas is supplied from supply 38 under the control of microcontroller 46, at a first flow rate, which is preferably in a range of 100-200 l/min, more preferably in an range of 120-180 l/min, most preferably in a range of 140-160 l/min, and optimally about 150 l/min. When the temperature sensor 62 detects that the housing interior has been cooled to a predetermined temperature, microcontroller 46 substantially reduces the gas flow to a second flow rate, which is preferably in a range of 10-80 l/min, more preferably in an range of 15-60 l/min, most preferably in a range of 20-40 l/min, and optimally about 30 l/min in this embodiment.

The reason for continuing the gas flow at a lower rate after the housing has sufficiently cooled is to provide a fluid seal that prevents ingress of process liquids into housing 14 through outlets 36. Thus any flow rate of gas sufficient to achieve that end is contemplated for the second flow rate, although the particular rate will vary depending upon processing conditions and the process liquids to be excluded.

The apparatus according to this embodiment is preferably utilized over a wafer heating temperature range of 50-100° C., which corresponds to a heating energy range of 2-4 kW for preferred infrared heating elements. In relation to the above-referenced commonly-owned application, wafer to wafer drift is further reduced and repeat accuracy, wafer temperature uniformity, and wafer heating and cooling times are further improved.

Referring now to FIGS. 3 and 5, a second embodiment of a method and apparatus according to the present invention differs from that previously described in that the outlets 56 replace the outlets 36 and are oriented axially upwardly so as to discharge convectively heated gas from the housing 14 onto the downwardly facing surface of wafer W. As the upwardly facing openings 56 are in the peripheral region of the chuck 1, they can also be used for providing a gas cushion for establishing a Bernoulli effect so as to support a wafer without subjacent support from the chuck pins.

Furthermore, in this second embodiment, the interior chamber is omitted, such that the channels 28-1 through 28-4 extend to the recess in which the heating element 12 is received, and which is complementary in shape thereto. In this embodiment, gas may be supplied into housing 14 while the heating element 12 is switched on, so that wafer W is heated by the dual mechanism of radiant heat from the IR element 12 and convective heating from the heated gas that is discharged through openings 56.

This embodiment may optionally include an interior chamber as described in connection with the first embodiment, and it is also contemplated to provide both types of outlets, i.e., outlets 36 and 56, in a single embodiment.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. Apparatus for treating a wafer-shaped article, comprising:
   a spin chuck for holding a wafer-shaped article in a predetermined orientation relative to an upper surface of the spin chuck; and
   a heating assembly comprising a housing containing at least one infrared heating element, said heating assembly being mounted above said upper surface of said spin chuck and adjacent a wafer-shaped article when mounted on the spin chuck, wherein said housing comprises a gas inlet connected to a gas supply, and at least one outlet for discharging gas from said housing;
   wherein said heating assembly is mounted underlying a wafer-shaped article when mounted on the spin chuck, the heating assembly being stationary in relation to rotation of said spin chuck.

2. The apparatus according to claim 1, wherein said at least one outlet is positioned in a peripheral region of said spin chuck and opens on a radially outwardly facing surface of said housing.

3. The apparatus according to claim 1, wherein said at least one outlet opens on an axially upwardly facing surface of said housing, thereby to discharge gas from said housing onto a downwardly-facing surface of a wafer shaped article when mounted on said spin chuck.

4. The apparatus according to claim 1, further comprising a temperature sensor positioned within said housing and a flow controller that adjusts a flow of gas into said housing based upon a temperature detected within said housing.

5. The apparatus according to claim 4, wherein said flow controller is configured to set a flow of gas to a first flow rate when said temperature sensor detects a temperature in excess of a predetermined cooling point, and to set a flow of gas to a second flow rate when said temperature sensor detects a temperature not in excess of a predetermined cooling point, and wherein said second flow rate is less than said first flow rate.

6. The apparatus according to claim 1, wherein said at least one infrared heating element extends along a peripheral region of said housing and wherein said gas inlet opens into a central region of said housing, with an interior chamber being defined between said at least one infrared heating element and said gas inlet, thereby to promote cooling of said at least one infrared heating element by convective heating of a gas supplied via said gas inlet to said interior chamber.

7. Apparatus for treating a wafer-shaped article, comprising:
   a spin chuck for holding a wafer-shaped article in a predetermined orientation relative to an upper surface of the spin chuck; and
   a heating assembly comprising a housing containing at least one infrared heating element, said heating assembly being mounted above said upper surface of said spin chuck and adjacent a wafer-shaped article when mounted on the spin chuck, wherein said housing comprises a gas inlet connected to a gas supply, and at least one outlet for discharging gas from said housing;
   wherein said spin chuck comprises a chuck body mounted for rotation about a central stationary post, and wherein said housing comprises a proximal end rigidly secured to said central stationary post and a distal end positioned above said chuck body and supported in a cantilevered manner via said proximal end.

8. A process for treating a wafer-shaped article, comprising:
   positioning a wafer-shaped article on a spin chuck in a predetermined orientation wherein an infrared heating assembly comprising at least one infrared heating element contained with a housing is positioned adjacent the wafer-shaped article;

heating the wafer-shaped article with the infrared heating assembly; and introducing a gas into the housing through a gas inlet in the housing under conditions to cause conductive heating of the gas by the at least one infrared heating element; and discharging heated gas from the housing through at least one outlet in the housing;

wherein the heated gas is discharged axially upwardly from the housing onto a downwardly facing surface of the wafer-shaped article, thereby to heat the wafer shaped article conductively.

9. The process according to claim 8, wherein the heated gas is discharged radially outwardly of the housing and the spin chuck.

10. The process according to claim 8, wherein the at least one infrared heating element is switched off at a conclusion of said heating step, and wherein gas is then introduced into the housing of the heating assembly at a first flow rate until a temperature within the housing is lowered to a predetermined extent, and wherein the gas is then introduced into the housing of the heating assembly at a second flow rate, which is less than the first flow rate, after a temperature within the housing has been lowered to the predetermined extent.

11. The process according to claim 10, further comprising monitoring a temperature within the housing and adjusting a flow rate of gas into the housing based upon a temperature detected within the housing.

12. The process according to claim 8, further comprising rotating the spin chuck and the wafer shaped article during said heating, while maintaining the infrared heating assembly stationary relative to the spin chuck and the wafer shaped article.

13. The process according to claim 8, wherein gas is introduced into the housing of the infrared heating assembly during said heating step.

* * * * *